United States Patent
Kawachi

(10) Patent No.: US 8,255,842 B2
(45) Date of Patent: Aug. 28, 2012

(54) THIN-FILM TRANSISTOR CIRCUIT, DESIGN METHOD FOR THIN-FILM TRANSISTOR, DESIGN PROGRAM FOR THIN-FILM TRANSISTOR CIRCUIT, DESIGN PROGRAM RECORDING MEDIUM, DESIGN LIBRARY DATABASE, AND DISPLAY DEVICE

(75) Inventor: Genshiro Kawachi, Yokohama (JP)

(73) Assignee: Sharp Kabushiki Kaisha, Osaka (JP)

( * ) Notice: Subject to any disclaimer, the term of this patent is extended or adjusted under 35 U.S.C. 154(b) by 839 days.

(21) Appl. No.: 12/246,831

(22) Filed: Oct. 7, 2008

(65) Prior Publication Data

US 2009/0044161 A1  Feb. 12, 2009

Related U.S. Application Data

(62) Division of application No. 11/133,321, filed on May 20, 2005, now Pat. No. 7,464,364.

(30) Foreign Application Priority Data

Jun. 10, 2004  (JP) ................................. 2004-172647
May 11, 2005  (JP) ................................. 2005-138732

(51) Int. Cl.
*G06F 17/50* (2006.01)
(52) U.S. Cl. ............. 716/55; 716/53; 716/105; 716/132
(58) Field of Classification Search .................... 716/53, 716/55, 105, 132
See application file for complete search history.

(56) References Cited

U.S. PATENT DOCUMENTS

| 7,067,983 B2 | 6/2006 | Ozawa et al. |
| 7,355,575 B1* | 4/2008 | Ota et al. ........................ 345/87 |
| 7,410,848 B2* | 8/2008 | Jyumonji et al. ............. 438/166 |
| 2003/0071312 A1 | 4/2003 | Oana et al. |

FOREIGN PATENT DOCUMENTS

| JP | 2002-237455 | 8/2002 |
| JP | 2003-22969 | 1/2003 |
| JP | 2003-31497 | 1/2003 |
| JP | 2003-86604 | 3/2003 |
| JP | 2003-124230 | 4/2003 |
| JP | 2003-197521 | 7/2003 |
| JP | 2003-197527 | 7/2003 |
| JP | 2003-241361 | 8/2003 |
| JP | 2003-308038 | 10/2003 |
| JP | 2003-318127 | 11/2003 |
| WO | WO 03/088331 A1 | 10/2003 |
| WO | WO 03/092061 A1 | 11/2003 |

OTHER PUBLICATIONS

Office Action issued May 17, 2011, in Japan Patent Application No. 2005-138732 (with English translation).

* cited by examiner

*Primary Examiner* — Thuan Do
(74) *Attorney, Agent, or Firm* — Birch, Stewart, Kolasch & Birch, LLP

(57) ABSTRACT

A thin-film transistor circuit includes a crystallized semiconductor thin film two-dimensionally partitioned into crystal-grain-defining areas each of which accommodates a crystal grain larger than a predetermined size, thin-film transistors each of which has a channel region placed at the center position of a corresponding one of the crystal-grain-defining areas, and wirings which interconnect the thin-film transistors.

4 Claims, 14 Drawing Sheets

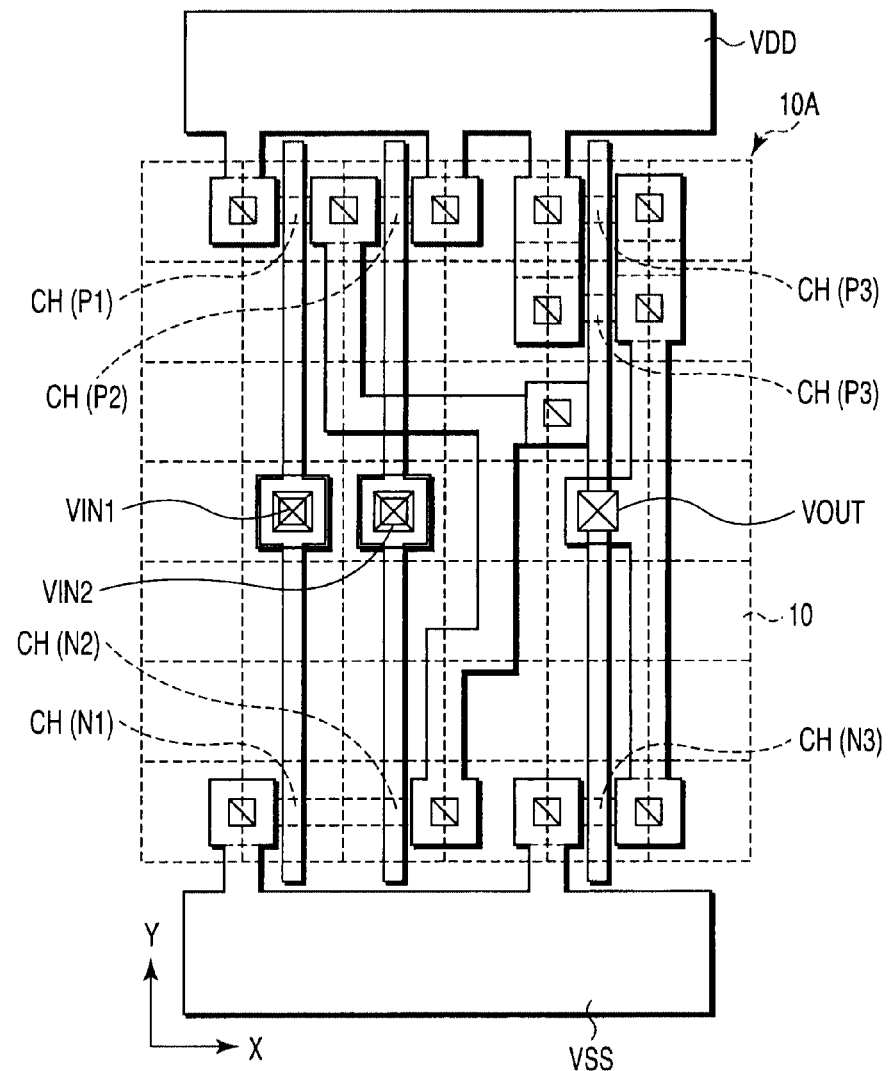
F I G. 11

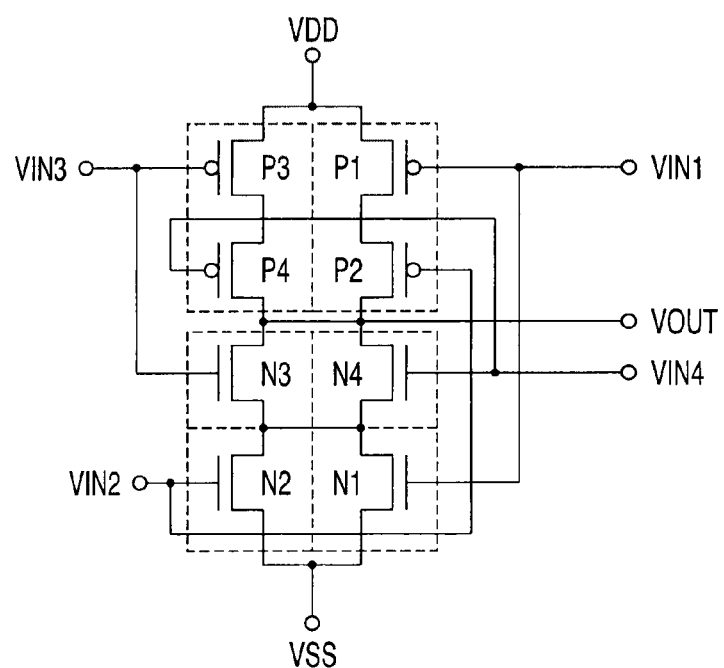
F I G. 12

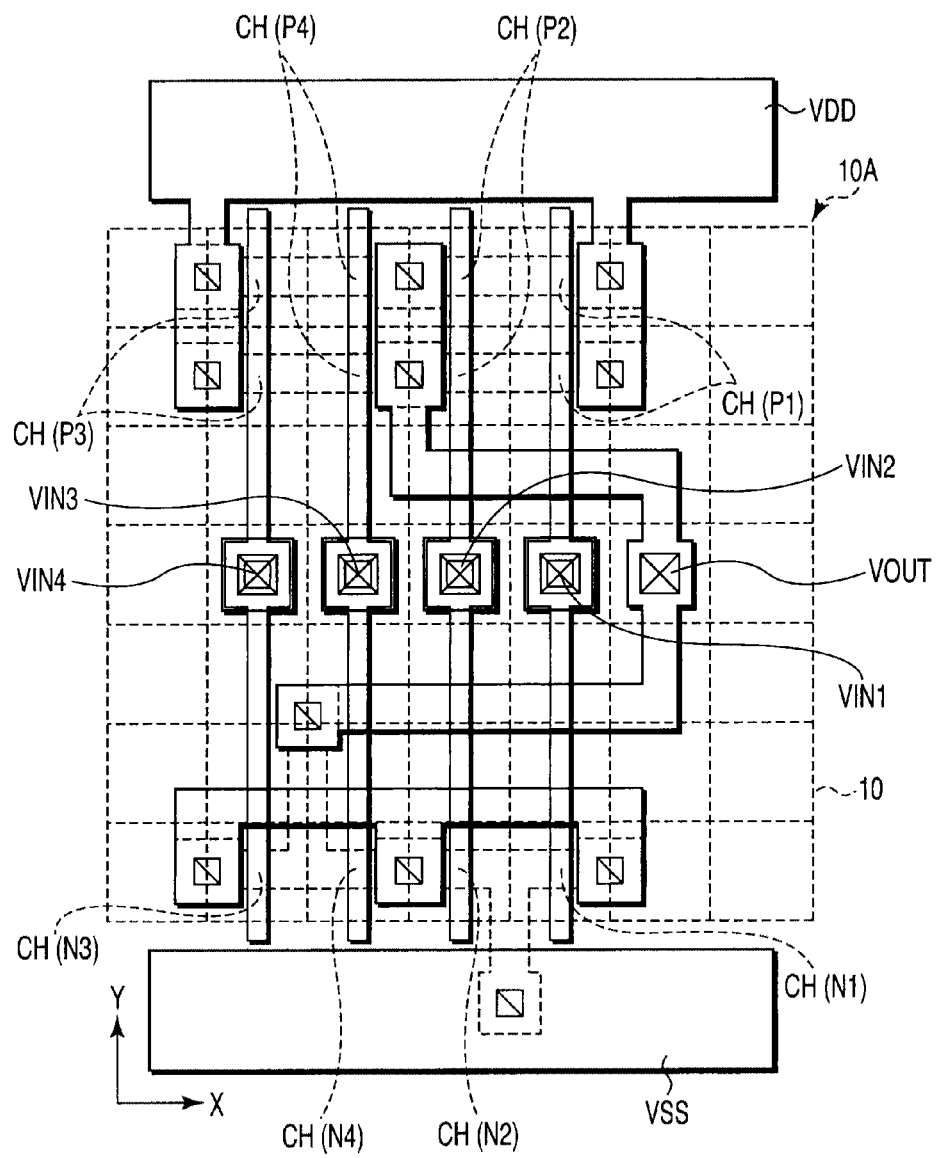
F I G. 13

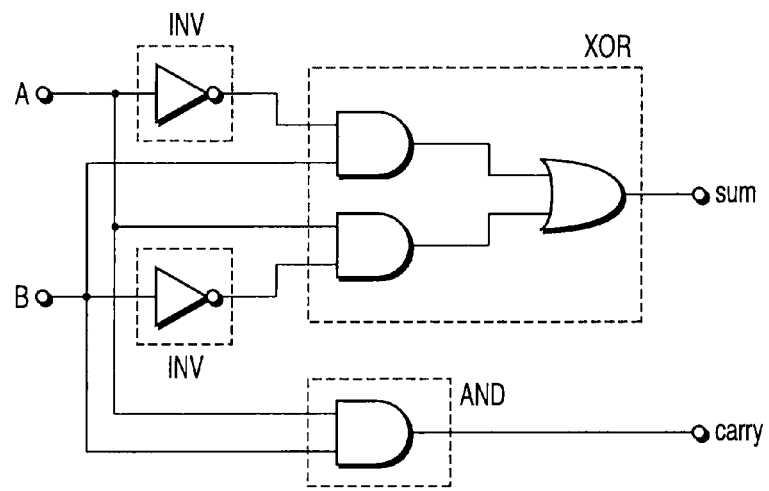
F I G. 14

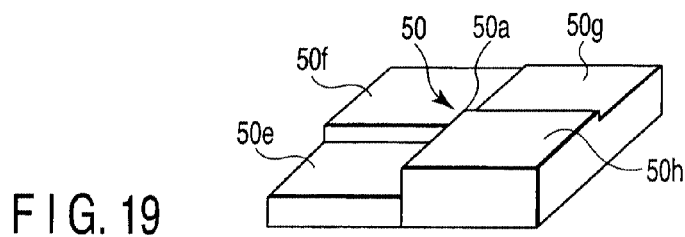
F I G. 19
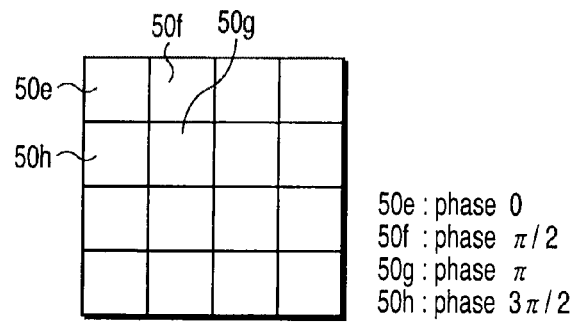
50e : phase 0
50f : phase $\pi/2$
50g : phase $\pi$
50h : phase $3\pi/2$
F I G. 20
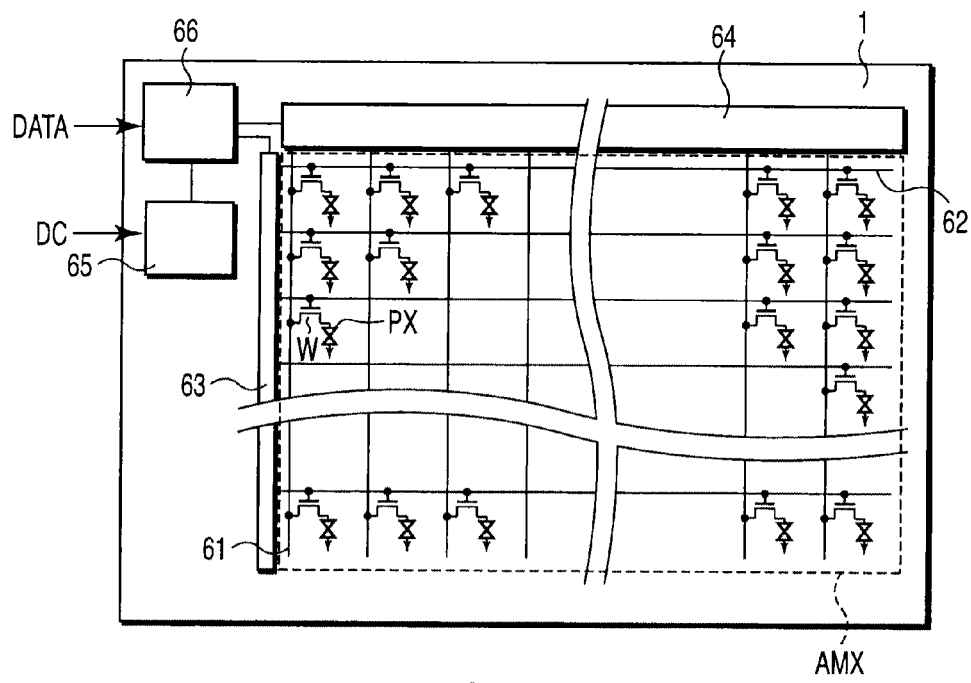
F I G. 21

US 8,255,842 B2

THIN-FILM TRANSISTOR CIRCUIT, DESIGN METHOD FOR THIN-FILM TRANSISTOR, DESIGN PROGRAM FOR THIN-FILM TRANSISTOR CIRCUIT, DESIGN PROGRAM RECORDING MEDIUM, DESIGN LIBRARY DATABASE, AND DISPLAY DEVICE

CROSS-REFERENCE TO RELATED APPLICATIONS

This application is a Divisional Application of application Ser. No. 11/133,321 filed May 20, 2005 and is based upon and claims the benefit of priority from prior Japanese Patent Applications No. 2004-172647, filed Jun. 10, 2004; and No. 2005-138732, filed May 11, 2005, the entire contents of both of which are incorporated herein by reference.

BACKGROUND OF THE INVENTION

1. Field of the Invention

The present invention relates to a thin-film transistor circuit that uses a crystallized semiconductor thin film having crystal grains of relatively large size, a design method for the thin-film transistor circuit, a design program for the thin-film transistor circuit, a design program recording medium, a design library database, and a display device.

2. Description of the Related Art

Flat-panel display devices have found use in various fields because of their features of thinness, lightness, and low power dissipation. Above all, active-matrix flat-panel display devices have been widely used in OA equipment in which high resolution and high picture quality are required. This type of display device includes a number of thin-film transistors (TFTs) each of which is placed adjacent to a respective one of pixels arranged in the form of a matrix and connected to it as a pixel switching element. With the recent development of multimedia communication technology, a function-intensive flat-panel display device has attracted attention as a display device for next generation personal uses. This flat-panel display device has a structure, called a system on panel, in which diversified peripheral circuits including a driver circuit, a memory circuit, a DA conversion circuit, and a image processing circuit, which are associated with image display, are integrated together with the pixel array.

In order to realize the function-intensive display device, it is required to constitute peripheral circuit components, such as logic circuits, memory elements, analog amplifiers, etc., by thin-film transistors using a semiconductor thin film of high carrier mobility formed on an insulating substrate made of glass or the like. Heretofore, various techniques have been proposed to form such a thin film at low temperatures.

With a recrystallization method using laser light, it is possible to obtain a silicon film having crystal grains of, say, a rectangular shape as a crystallized semiconductor thin film (see, for example, Japanese Unexamined Patent Publications Nos. 2002-237455 and 2003-22969).

Transistors are individually placed in crystal grains of a crystallized semiconductor thin film obtained by the recrystallization method using laser light (see, for example, Japanese Unexamined Patent Publications Nos. 2003-86604, 2003-31497, 2003-124230, 2003-318127, 2003-197521, 2003-197527).

The above-mentioned Patent Publications disclose techniques to obtain crystal grains sufficiently large in size to accommodate the channel regions of thin-film transistors, but do not disclose techniques to properly and efficiently design a thin-film transistor circuit, such as a peripheral circuit, on a crystallized semiconductor thin film having such crystal grains.

In the manufacture of a thin-film transistor circuit, it is required to prepare various photomasks for patterning a crystallized semiconductor thin film and wiring layers. The aforementioned conventional techniques will not be sufficient to prepare practical photomasks.

In preparing photomasks, it is required to determine the arrangements of thin-film transistors and wirings necessary for a thin-film transistor circuit and reflect these arrangements in various photomasks. With a large-scale thin-film transistor circuit, however, laying out all the thin-film transistors and wirings artificially would inevitably increase the design period and the frequency of occurrence of erroneous wirings, resulting in an accelerative increase in design cost.

Conventionally, there exists a design tool which is a computer that simulates a thin-film transistor circuit. The use of this design tool allows the layout of thin-film transistors and wirings to be automated. This layout result allows for the channel regions of thin-film transistors to be placed in portions of poor crystallinity of a crystallized semiconductor thin film. It is therefore difficult to apply the automated layout to photomasks for a thin-film transistor circuit using a crystallized semiconductor thin film.

In the aforementioned Patent Publication No. 2003-31497 or 2003-318127, methods are disclosed which form crystal grains of large area through the use of a phase-shifting laser-based crystallization method. When this method is used in forming an actual thin-film transistor circuit, in order to form crystallized areas corresponding in arrangement to thin-film transistors constituting the transistor circuit, it is required to specially design the pattern of a phase-shifting mask for phase-modulation of laser light. The disclosed contents of the aforementioned known documents are not sufficient to efficiently prepare a practical phase-shifting mask.

BRIEF SUMMARY OF THE INVENTION

It is an object of the present invention to provide a design method for a thin-film transistor circuit, a design program for a thin-film transistor circuit, a recording medium storing a design program, a design library database, a thin-film transistor circuit, and a display device, each of which allows the fabrication of photomasks suitable and effective for a crystallized semiconductor thin film.

According to a first aspect of the present invention, there is provided a design method for a thin-film transistor circuit using a crystallized semiconductor thin film, the method comprising the steps of: defining in a computer a crystallization array-pattern representing the arrangement of crystal-grain-defining areas which are arrayed for two-dimensional partitioning of the crystallized semiconductor thin film and each of which accommodates a crystal grain larger than a predetermined size; and causing the computer to, on the basis of the crystallization array-pattern, create a device pattern of thin-film transistors each of which has a channel region placed at a position fixed in a corresponding one of the crystal-grain-defining areas and a wiring pattern of wirings which interconnect the thin-film transistors.

According to a second aspect of the present invention, there is provided a design program for a thin-film transistor circuit using a crystallized semiconductor thin film, which causes a computer to carry out the processes of: defining a crystallization array-pattern representing the arrangement of crystal-grain-defining areas which are arrayed for two-dimensional partitioning of the crystallized semiconductor thin film and each of which accommodates a crystal grain larger than a predetermined size; and, on the basis of the crystallization array-pattern, creating a device pattern of thin-film transistors each of which has a channel region placed at a position fixed in a corresponding one of the crystal-grain-defining areas and a wiring pattern of wirings which interconnect the thin-film transistors.

According to a third aspect of the present invention, there is provided a design program recording medium recorded with a design program for a thin-film transistor circuit using a crystallized semiconductor thin film, which causes a computer to carry out the processes of: defining a crystallization array-pattern representing the arrangement of crystal-grain-defining areas which are arrayed for two-dimensional partitioning of the crystallized semiconductor thin film and each of which accommodates a crystal grain larger than a predetermined size; and, on the basis of the crystallization array-pattern, creating a device pattern of thin-film transistors each of which has a channel region placed at a fixed position within a corresponding one of the crystal-grain-defining areas and a wiring pattern of wirings which interconnect the thin-film transistors.

According to a fourth aspect of the present invention, there is provided a design program for a thin-film transistor circuit using a crystallized semiconductor thin film, which causes a computer to carry out the processes of: defining a crystallization array-pattern representing the arrangement of crystal-grain-defining areas which are arrayed for two-dimensional partitioning of the crystallized semiconductor thin film and each of which accommodates a crystal grain larger than a predetermined size; on the basis of the crystallization array-pattern, creating a device pattern of thin-film transistors each of which has a channel region placed at a position fixed in a corresponding one of the crystal-grain-defining areas and a wiring pattern of wirings which interconnect the thin-film transistors; and determining a phase-shifting mask pattern according to the crystallization array-pattern to define the crystal-grain-defining areas which are adapted to the device pattern of the thin-film transistors and realized on a semiconductor thin film by means of a laser-based crystallization method.

According to a fifth aspect of the present invention, there is provided a design program recording medium recorded with a design program for a thin-film transistor circuit using a crystallized semiconductor thin film, which causes a computer to carry out the processes of: defining a crystallization array-pattern representing the arrangement of crystal-grain-defining areas which are arrayed for two-dimensional partitioning of the crystallized semiconductor thin film and each of which accommodates a crystal grain larger than a predetermined size; on the basis of the crystallization array-pattern, creating a device pattern of thin-film transistors each of which has a channel region placed at a position fixed in a corresponding one of the crystal-grain-defining areas and a wiring pattern of wirings which interconnect the thin-film transistors; and determining a phase-shifting mask pattern according to the crystallization array-pattern to define the crystal-grain-defining areas which are adapted to the device pattern of the thin-film transistors and realized on a semiconductor thin film by means of a laser-based crystallization method.

According to a sixth aspect of the present invention, there is provided a design library database for a thin-film transistor circuit using a crystallized semiconductor thin film, containing at least one of standard cells representing various logic gate circuits and macrocells each representing a combination of some of the logic gate circuits, wherein each logic gate circuit includes two or more thin-film transistors each having a channel region placed at a position fixed in one of the crystal-grain-defining areas, and wirings which interconnect the two or more thin-film transistors.

According to a seventh aspect of the present invention, there is provided a thin-film transistor circuit comprising: a crystallized semiconductor thin film two-dimensionally partitioned into crystal-grain-defining areas each of which accommodates a crystal grain larger than a predetermined size; thin-film transistors each of which has a channel region placed at a position fixed in a corresponding one of the crystal-grain-defining areas; and wirings which interconnect the thin-film transistors.

According to an eighth aspect of the present invention, there is provided a display device comprising: an active-matrix circuit having pixels arrayed in a matrix form; a drive control circuit connected to the active-matrix circuit; and a thin-film semiconductor substrate which supports the active-matrix circuit and the drive control circuit, wherein the drive control circuit includes a thin-film transistor circuit comprising a crystallized semiconductor thin film two-dimensionally partitioned into crystal-grain-defining areas each of which accommodates a crystal grain larger than a predetermined size; thin-film transistors each of which has a channel region placed at a position fixed in a corresponding one of the crystal-grain-defining areas; and wirings which interconnect the thin-film transistors.

In the design method, the design program, the design program recording medium, the design library database, the thin-film transistor circuit, and the display device, a crystallized semiconductor thin film is partitioned into crystal-grain-defining areas each of which accommodates a crystal grain larger than a predetermined size and the channel region of each thin-film transistor is placed at a position fixed in a corresponding one of the crystal-grain-defining areas. Thus, by laying out the thin-film transistors and the wirings in units of crystal-grain-defining areas, the positional relationship between the channel regions and the crystal grains can be optimized. Further, a layout condition of crystal-grain-defining areas units allows the layout to be automated using a computer as a design tool. Thus, it becomes possible to fabricate photomasks suitable and effective for the crystallized semiconductor thin film, allowing the design cost to be reduced.

Moreover, by automatically determining the phase-shifting mask pattern according to the crystallization array-pattern, the time taken to design the phase-shifting mask can be reduced significantly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate an embodiment of the invention, and together with the general description given above and the detailed description of the embodiment given below, serve to explain the principles of the invention.

FIG. 11 shows a standard cell for the AND circuit shown in FIG. 10;

FIG. 12 shows an equivalent circuit of an XOR circuit used in the design process shown in FIG. 5;

FIG. 13 shows a standard cell for the XOR circuit shown in FIG. 12;

FIG. 14 shows a half-adder including the inverter circuit, AND circuit and XOR circuit whose equivalent circuits are shown in FIGS. 7, 10 and 12;

FIG. 19 is a diagram for explaining another phase shifter used in the laser-annealing process for forming the crystallized semiconductor thin film shown in FIG. 1;

FIG. 20 shows the phase differences between areas shown in FIG. 19;

FIG. 21 schematically shows the structure of an active-matrix liquid crystal display device into which thin-film transistor circuits designed through the design process shown in FIG. 5 are incorporated.

DETAILED DESCRIPTION OF THE INVENTION

A thin-film transistor circuit according to an embodiment of the present invention will be described hereinafter with reference to the accompanying drawings.

Figure 1:
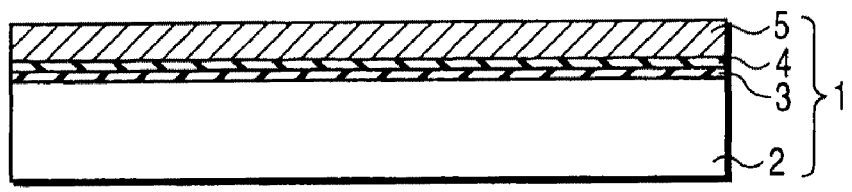
FIG. 1 shows the sectional structure of a thin-film semiconductor substrate used in manufacturing a thin-film transistor circuit according to an embodiment of the present invention.
Figure 2:
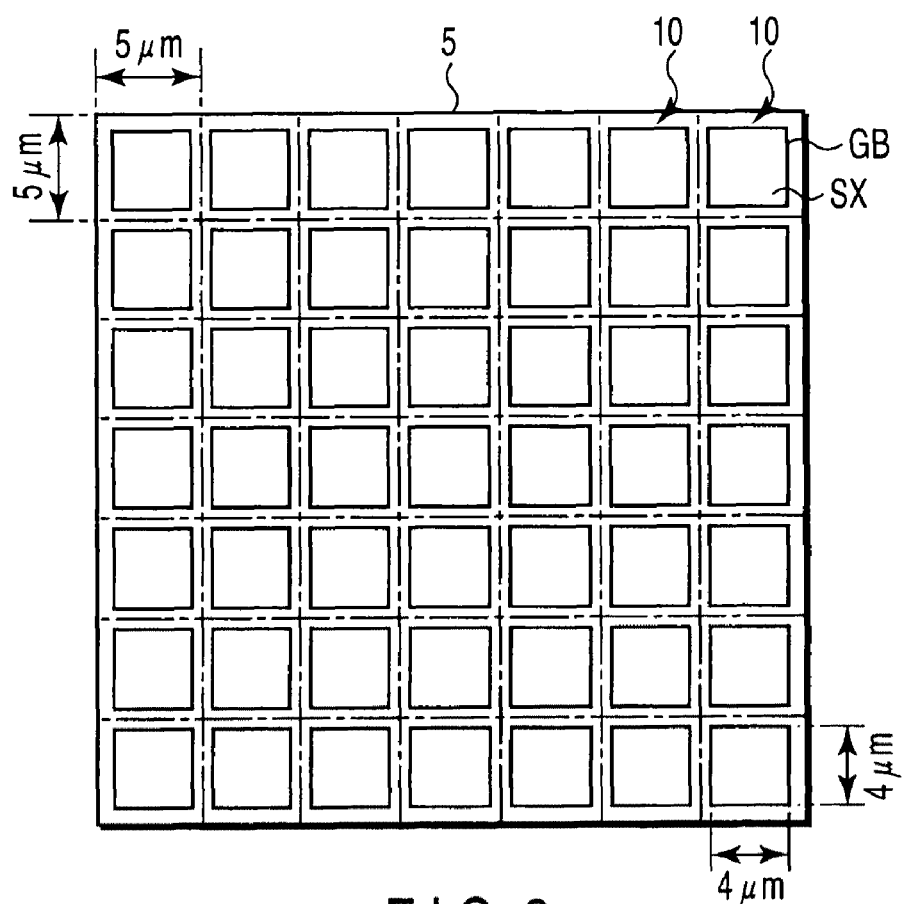
FIG. 2 shows the planar structure of the thin-film semiconductor substrate shown in FIG. 1.

FIG. 1 shows a sectional structure of a thin-film semiconductor substrate 1 used in manufacturing the thin-film transistor circuit, and FIG. 2 shows a planar structure of the thin-film semiconductor substrate 1. The thin-film semiconductor substrate 1 is composed of a transparent dielectric substrate 2 such as of no-alkali glass, an SiNx film 3 formed on the trans-parent dielectric substrate 2, an $SiO_2$ film 4 formed on the SiNx film, and a crystallized semiconductor thin film 5. The crystallized semiconductor thin film 5 is obtained, for example, by crystallizing an amorphous silicon film, and comprises crystal grains SX arrayed at regularly spaced intervals in the form of a matrix and amorphous silicon or polycrystalline silicon of fine grain size to surround the crystal grains SX. That is, the crystallized semiconductor thin film 5 is two-dimensionally partitioned into crystal-grain-defining areas 10 each of which accommodates a respective one of the crystal grains SX larger than a predetermined size. Each of the crystal grains SX is monocrystalline silicon of a nearly rectangular shape of about 4 by 4 µm. Each of the crystal-grain-defining areas 10 is slightly larger than the crystal grains SX and has dimensions of about 5 by 5 µm.

Figure 3:
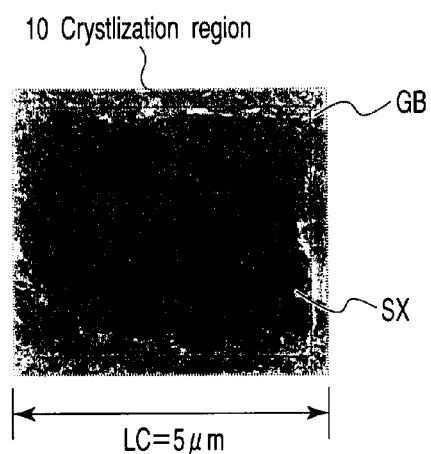
FIG. 3 shows an electron-microscopic image of one of the crystal-grain-defining areas shown in FIG. 2.

FIG. 3 shows an electron-microscopic image of one of the crystal drain defining areas 10 shown in FIG. 2. In each crystal-grain-defining area, a grain boundary GB is present in a portion of about 0.5 µm in width from the periphery. This portion forms an electrically active faulty region which act as the generation/recombination center of carriers; therefore, it is desirable to exclude the portion from the channel region of a thin-film transistor. The predetermined size is referenced to the size of the channel region of each thin-film transistor.

The aforementioned crystallized semiconductor thin film 5 is monocrystalline only in portions corresponding to the crystal grains SX located inside the faulty regions and hence greatly differs from a normal monocrystalline semiconductor substrate which is monocrystalline overall. In manufacturing the thin-film transistor circuit using such a crystallized semiconductor thin film 5, it is effective that the specific crystal structure of the crystallized semiconductor thin film 5 is reflected in the layout of the thin-film transistor, in order to obtain high-performance and uniform characteristics.

Figure 4:
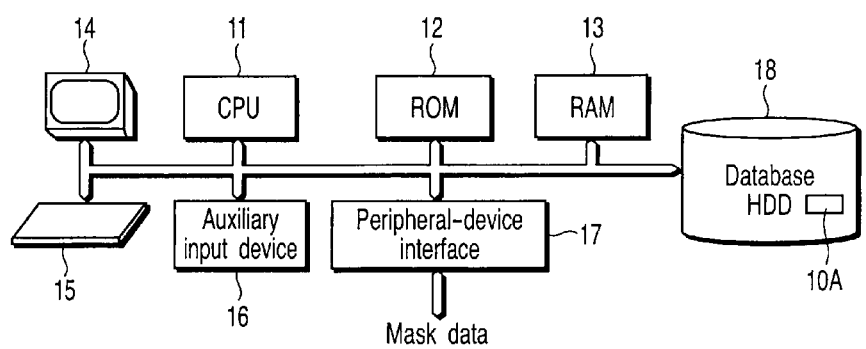
FIG. 4 schematically shows the structure of a computer which simulates a thin-film transistor circuit as a design tool for the thin-film semiconductor substrate shown in FIG. 1.

FIG. 4 schematically shows the structure of a computer which simulates a thin-film transistor circuit as a design tool. This computer includes a CPU 11 which controls the overall operation, a ROM 12 which stores various pieces of fixed data, a RAM 13 which temporarily stores data input to and output from the CPU 11, a display device 14 which displays various images under the control of the CPU 11, a keyboard 15 which enters various pieces of data into the CPU 11, an auxiliary input device 16, such as a pointing device, which specifies a coordinate position in an image displayed on the display device, a peripheral-device interface 17 which receives data from and sends data to external peripheral devices, and a hard disk drive 18 which stores a design program to be executed by the CPU 11, a library database and so on.

The computer performs a process of designing a thin-film transistor circuit by executing the design program stored in the hard disk drive 18. In this design process, the CPU 11 defines a crystallization array-pattern 10A representing the arrangement of the crystal-grain-defining areas 10 which are arrayed for two-dimensional partitioning of a crystallized semiconductor thin film 5 and each of which accommodates a respective one of the crystal grains SX larger than a predetermined size. On the basis of the crystallization array-pattern 10A, the CPU 11 creates a device pattern of thin-film transistors each of which has its channel region placed at a position fixed in a corresponding one of the crystal-grain-defining areas and a pattern of wirings which interconnect the thin-film transistors. The crystallization array-pattern 10A is configured such that the crystal-grain-defining areas 10 are arrayed in the form of a matrix and each accommodate a crystal grain of a nearly rectangular shape.

The hard disk drive 18 stores a library database containing standard cells and macrocells registered therein. The standard cells represent various logic gate circuits. Each logic gate circuit includes two or more thin-film transistors each of which has a channel region placed at a position fixed in one of the crystal-grain-defining areas 10, and wirings which interconnect the two or more thin-film transistors. The macrocells represent combinations of the various logic gate circuits. In creating the device pattern and the wiring pattern, the CPU 11 refers to the library database on the basis of externally input circuit information. The library database may contain only the standard cells; however, it is more efficient for it to further contain the macrocells.

It is desirable that, in the device pattern, the channel length and width of each of the thin-film transistors be set to less than the length of one side of the crystal-grain-defining area 10. Thereby, it becomes possible to accommodate the entire channel region of each of these thin-film transistors within one crystal grain SX.

The thin-film transistors are arranged in the device pattern at intervals of integral multiples of the length of one side of the crystal-grain-defining area. That is, these transistors are arranged in units of crystal-grain-defining areas.

Supposing that the length of one side of the crystal-grain-defining area is LC, the dimension of the larger one of the channel length and width of each transistor is LG, and alignment tolerance between the crystallization array-pattern 10A and the device pattern is LA, it is important to satisfy a relationship such that $LC \geqq (LG+2 \times LA)$.

Figure 5:
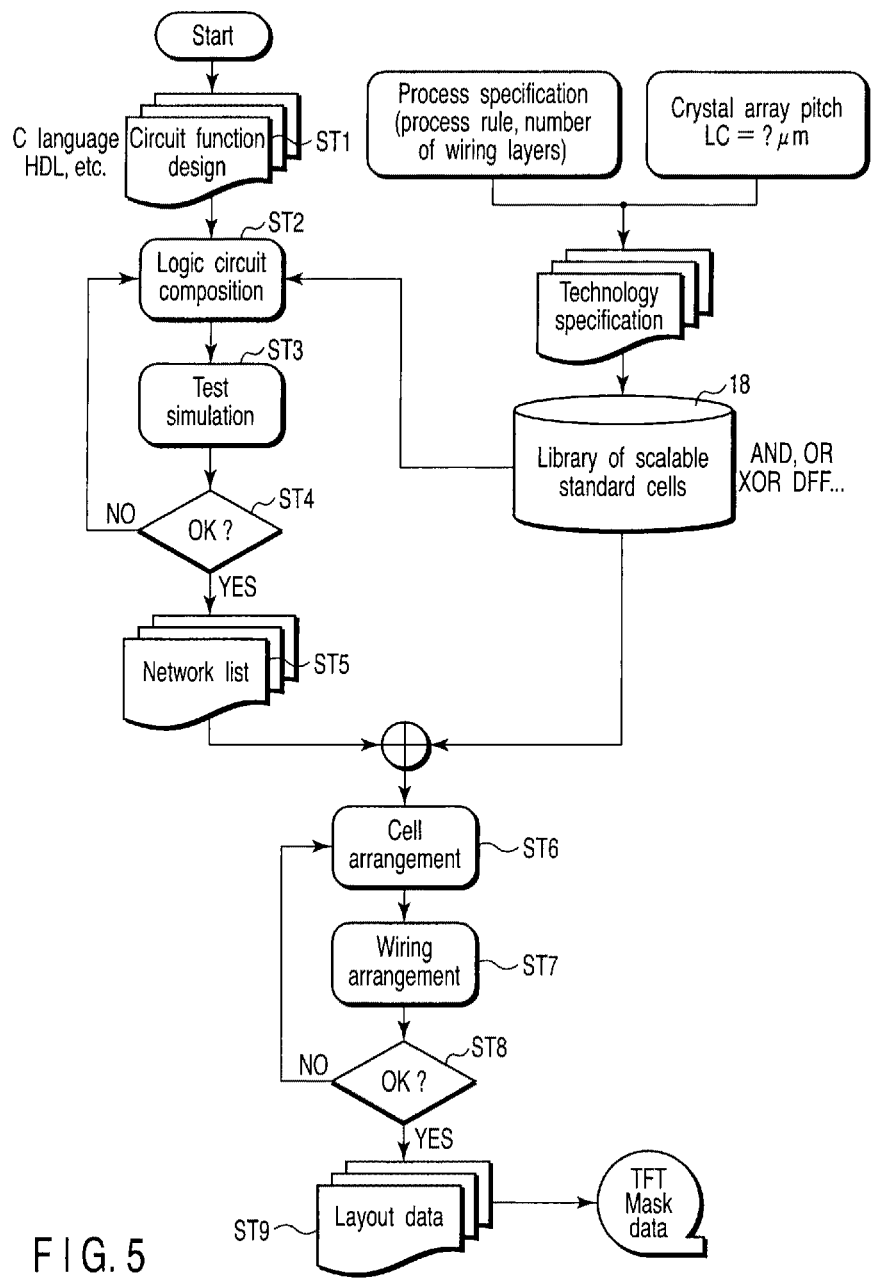
FIG. 5 is a flowchart illustrating the flow of a thin-film transistor circuit design process actually carried out by the computer shown in FIG. 4.

FIG. 5 illustrates the flow of a thin-film transistor circuit design process actually carried out by the computer shown in FIG. 4.

When, prior to circuit design, processing rules applied to a thin-film transistor circuit manufacturing process, the number of wiring layers and a pattern of a phase shifter used in crystallization are prepared as specifications of the crystallization array-pattern 10A, process technology specifications are determined from the specifications of the crystallization array-pattern 10A. Then, a library of the standard cells in which the pattern arrangements, the gate delay times, the driving abilities, and the like of various logic gate circuits are specified in accordance with the process technology specifications are registered as a library database in the hard disk drive 18. The standard cell library depends on the pattern arrangement of the crystal-grain-defining areas. Thus, the cell structure is made scalable by introduction of scaling parameters for automatically adjusting the layout positions of the thin-film transistors according to the pattern arrangement. Accordingly, reconfiguration of the standard cell library will not be required for a change in the dimensions of the crystal-grain-defining areas 10.

In the actual circuit design, the function of a thin-film transistor circuit to be implemented is described in step ST1 in the hardware description language HDL or the C language higher in the level of abstract than HDL. Logic circuit composition is performed in step ST2 on the basis of the contents of the description. At this time, a reference is made to the aforementioned standard cell library. The function of the thin-film transistor circuit are verified in step ST3 by performing a test simulation. If the results of simulation are satisfactory, the results of the logic circuit composition is acknowledged in step ST4 and then a network list is created in step ST5. Subsequently, the cell arrangement of logic gate circuits is determined based on the network list and the cell library information in step ST6, and wirings between cells are then determined in step ST7. The arrangement of cells is verified again in step ST8. If desired specifications are satisfied, the thin-film transistor circuit is acknowledged. In step S9, the layout data of the thin-film transistor circuit obtained virtually in the above manner is stored into the hard disk drive 18. Further, the layout data is converted into photomask data for the thin-film transistor circuit and output to an external TFT mask data storage.

The aforementioned design process, while being common in many respects to the design processes of commercially available semiconductor automated design tools, defines and registers not only standard cells forming a general-purpose library but also a standard cell of the crystallization array-pattern 10A representing the arrangement of crystal-grain-defining areas 10 which are arrayed for two-dimensional partitioning of the crystallized semiconductor thin film 5 and each of which accommodates a respective one of crystal grains SX larger than a predetermined size. By preparing the standard cell of such a crystallization array-pattern 10A as a layout condition, it becomes possible to automatically lay out the thin-film transistors and associated wiring layers.

Figure 6:
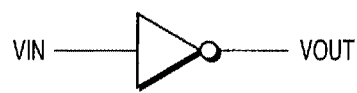
FIG. 6 shows an inverter circuit used in the design process shown in FIG. 5.
Figure 7:
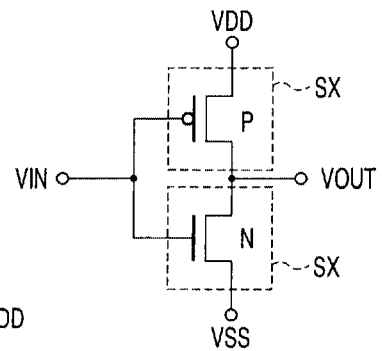
FIG. 7 shows an equivalent circuit of the inverter circuit shown in FIG. 6.

In the thin-film transistor circuit design process, such a circuit symbol as shown in FIG. 6 is used to stand for a CMOS inverter which is a logic gate circuit that forms part of a thin-film transistor circuit. The CMOS inverter is composed, as shown in FIG. 7, of a P-channel MOS transistor P and an N-channel MOS transistor N, which are thin-film transistors formed using different crystal grains SX. Each crystal grain SX has a square shape and measures 4 μm on a side. The configuration of the CMOS inverter is registered as a standard cell shown in FIG. 8. With this standard cell, the CMOS inverter occupies 7×4 crystal-grain-defining areas 10 arranged in the Y and X directions. The MOS transistors P and N are formed using two semiconductor islands SI which is obtained by patterning the crystallized semiconductor thin film 5 and each has source and drain regions arranged in the X direction within a corresponding semiconductor island SI, a channel region CH placed between within the corresponding semiconductor island SI, and a gate electrode GM placed above the channel region CH. The gate electrode GM extends in the Y direction. The length of the channel region CH is set to 1 μm for each of the P- and N-channel transistors P and N. The width of the channel region is set to 2 μm for the P-channel transistor and 1 μm for the N-channel transistor. The channel region CH of each of these transistors is placed with the center portion of one crystal-grain-defining area 10 as a target (fixed portion). Thus, the channel regions CH of the transistors are arranged in either of the X and Y directions in units of 5 μm, the array pitch of the crystal-grain-defining areas 10.

Figure 8:
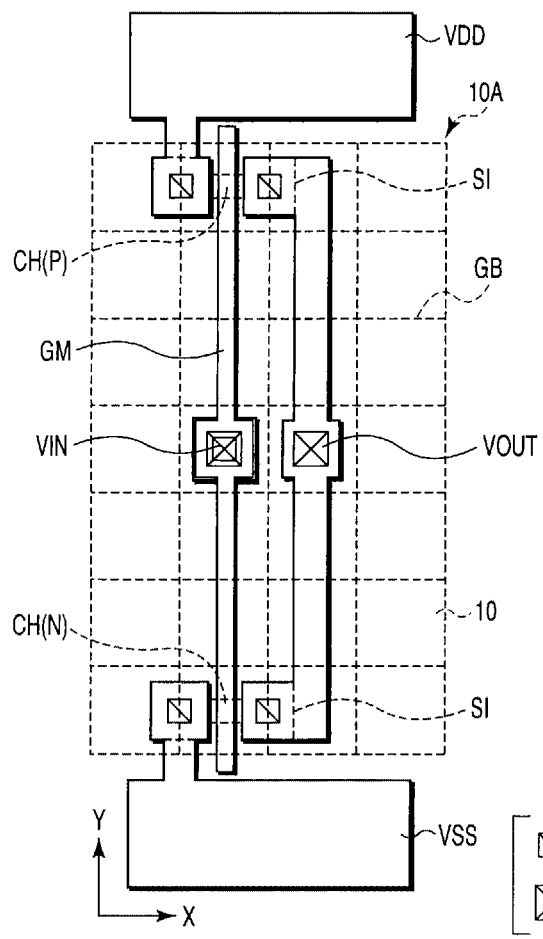
FIG. 8 shows a standard cell for the inverter circuit shown in FIG. 7.

In FIG. 8, VSS denotes a ground wiring which is part of a first-level Al (aluminum) wiring layer, VDD denotes a power source wiring which is another part of the first-level Al wiring layer, CONT1 denotes through holes for connecting the first-level Al wiring layer to the semiconductor island SI and the gate electrode GM, and CONT2 denotes through holes for connecting the first-level Al wiring layer to a second-level Al wiring layer for wiring between cells. The contact holes CONT1 are formed on the source and drain regions whose impurity concentration are set higher than that of the channel region CH in the semiconductor islands SI. Each of the source and drain regions is placed across the grain boundary GB. As long as the source and drain regions exhibit a desired low resistance, the presence of the drain boundary GB offers no problem in transistor operation.

In the design process, the wiring between standard cells is determined by recognizing the arrangement of a signal input portion VIN and a signal output portion VOUT shown in FIG. 8.

In this embodiment, the alignment tolerance LA between the crystallization array-pattern 10A and the device pattern is 0.5 μm, the length LC of one side of each crystal-graindefining area 10 is 5 μm, and the dimension LG of the larger one of the transistor channel length and width is 2 μm; thus, LC=5 and (LG+2×LA)=2+2×0.5=3, which satisfy the above-mentioned relationship LC≧(LG+2×LA).

With the use of a standard cell of the crystallization array-pattern 10A described above, the channel regions CH of the thin-film transistors are located only in the crystal grains SX which are surrounded by polycrystalline semiconductor of fine grain size in the crystallized semiconductor thin film 5. Thus, a high-performance circuit is attainable.

Figure 9:
FIG. 9 shows an AND circuit used in the design process shown in FIG. 5.

Furthermore, in the thin-film transistor circuit design process, such a circuit symbol as shown in FIG. 9 is used to stand for an AND circuit which is a logic gate circuit that forms part of the thin-film transistor circuit. The AND circuit has a CMOS structure shown in FIG. 10, for example, and comprises P-channel transistors P1 to P3 and N-channel transistors N1 to N3, which are thin-film transistors formed using different crystal grains SX. The logical product of input signals at first and second signal inputs VIN1 and VIN2 is output at a signal output VOUT. The configuration of the AND circuit is registered as a standard cell shown in FIG. 11. The channel length of the channel region CH is set to 1 μm for all the transistors P1 to P3 and N1 to N3. The channel width is set to 2 μm for the N-channel transistors N1 to N3 and the P-channel transistors P1 and P2 and 4 μm for the P-channel transistor P3. As in the standard cell shown in FIG. 8, the channel region CH of each of these transistors is placed with the center portion of one crystal-grain-defining area 10 as a target. For the transistor P3 having a particularly large channel width, it is formed of two sub-transistors which have channel regions assigned to the crystal-grain-defining areas 10 in different semiconductor islands so as not to contain the grain boundary GB and are connected in parallel so as to obtain the channel width in total.

To operate the pair of sub-transistors as the transistor P3, the channel regions of the sub-transistors are formed in the surface of crystal grains having identical crystal plane indexes, and the connection of the sub-transistors is set to have main current directions identical to each other.

Moreover, in the thin-film transistor circuit design process, an XOR circuit, for example, is used as a logic gate circuit which forms part of the thin-film transistor circuit. The XOR circuit has a CMOS structure shown in FIG. 12, for example, and comprises P-channel MOS transistors P1 to P4 and N-channel MOS transistors N1 to N4, which are thin-film transistors formed using different crystal grains SX. The exclusive logical sum of input signals from first and second signal inputs VIN1 and VIN2 is output at the signal output VOUT. The configuration of the XOR circuit is registered as a standard cell shown in FIG. 13. The length of the channel region CH is set to 1 μm for all the transistors P1 to P4 and N1 to N4. The channel width is set to 2 μm for the transistors N1 to N4 and 4 μm for the transistors P1 to P4. The channel region CH of each of these transistors is placed with the center of one crystal-grain-defining area 10 as a target. As in the AND circuit shown in FIG. 11, each of the P-channel transistors P1 to P4 is formed of two sub-transistors connected in parallel, and its channel width (=4 μm) is obtained as the total channel width (=2 μm×2) of the sub-transistors.

The standard cells shown in FIGS. 8, 11 and 13 are part of the standard cell library used in circuit design. Standard cells for many other logic gate circuits are actually registered in the standard cell library. Like the standard cells shown in FIGS. 8, 11 and 13, all the standard cells for logic gate circuits have a feature of occupying seven crystal-grain-defining areas 10 arrayed in the Y direction within the planar circuit pattern. The number of crystal-grain-defining areas occupied in the X direction may vary with the circuit scale.

Figure 10:
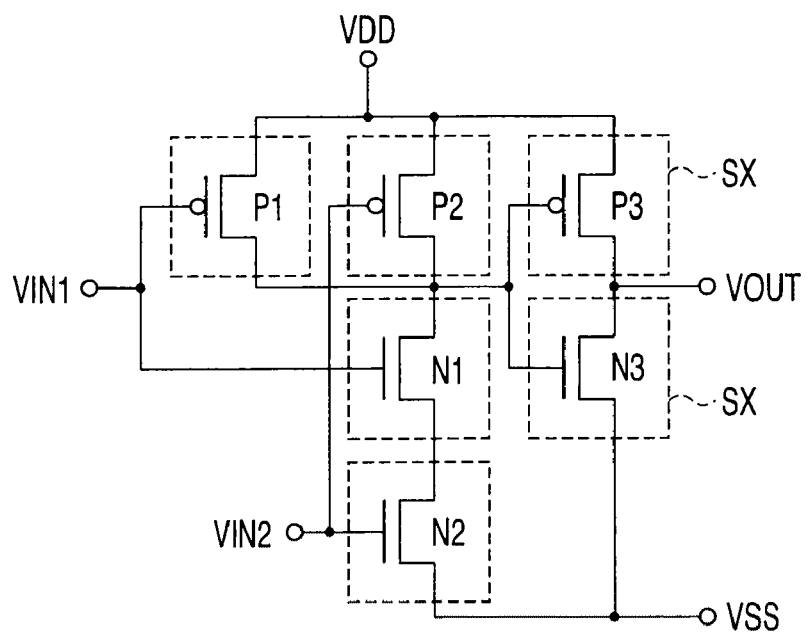
FIG. 10 shows an equivalent circuit of the AND circuit shown in FIG. 9.
Figure 15:
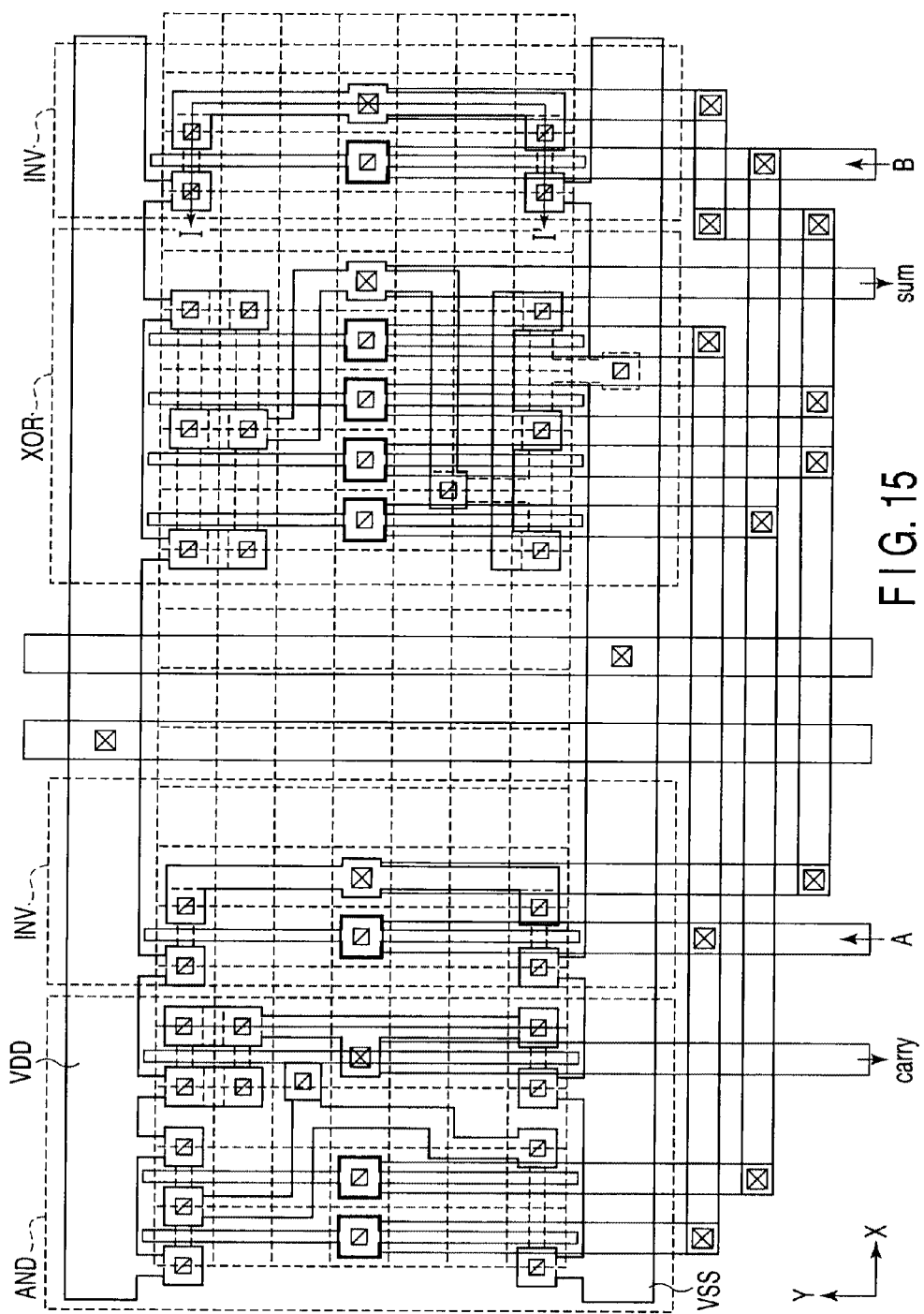
FIG. 15 shows a macrocell for the half-adder which is a combination of the standard cells shown in FIGS. 8, 11 and 13.

FIG. 14 shows a half-adder including the inverter circuit, AND circuit and XOR circuit whose equivalent circuits are shown in FIGS. 7, 10 and 12. Specifically, two inverters INV, one AND circuit AND, and one XOR circuit XOR are provided in the half-adder. FIG. 15 shows a macrocell cell for the half-adder which is a combination of the standard cells shown in FIGS. 8, 11 and 13. This macrocell can be registered in the library database together with the standard cells. In the macrocell, the standard cells are interconnected by wirings automatically determined in the design process.

The dimension in the Y direction is normalized for all the standard cells. Thus, by arranging the standard cells in the X direction and automatically laying power-source and ground wirings on these cells, a logic circuit block of a desired function can be obtained virtually. The cells are interconnected through the first-level Al wirings placed outside the cell placed area and parallel to the ground wiring, the second-level Al wirings placed to extend from input and output contacts of the cells in the direction perpendicular to the ground wiring, and through holes CONT2 connecting the first-level and second-level Al wirings. The cells are placed relative to each other so that the regular placement of the channel regions of the respective thin-film transistors are maintained as a whole and moreover on the basis of the standard cell of the crystallization array-pattern. As a result, all the thin-film transistors constituting a thin-film transistor circuit can be placed to conform to the array pitch of the crystal grains SX.

Figure 16:
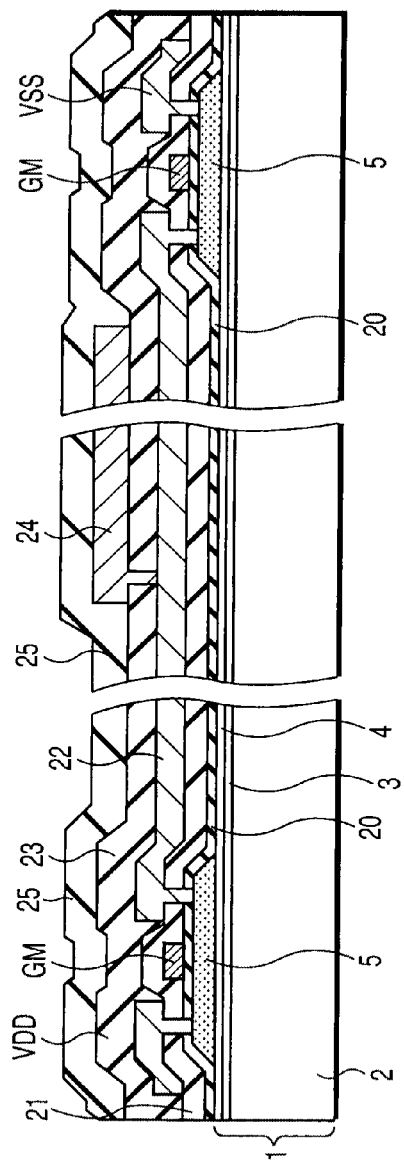
FIG. 16 is a sectional view of the half-adder taken along line I-I' of FIG. 15.

FIG. 16 shows the sectional structure of the half-adder taken along line I-I' of FIG. 15. As described above, the thin-film semiconductor substrate 1 is formed from the transparent dielectric substrate 2 such as of no-alkali glass, the SiNx film 3 formed on the transparent dielectric substrate 2, the $SiO_2$ film 4 formed on the SiNx film 3, and the crystallized semiconductor thin film 5 such as crystallized silicon. The SiNx film 3 is formed as a buffer dielectric film to prevent the diffusion of impurities from the transparent dielectric substrate 1. The thicknesses of the SiNx film 3, the $SiO_2$ film 4 and the crystallized semiconductor thin film 5 are 50, 100, and 200 nm, respectively. The crystallized semiconductor thin film 5 is covered with a gate dielectric film 20 of $SiO_2$ which has a thickness of 30 nm. A gate electrode GM of MoW alloy is formed on the gate dielectric film 20.

The entire structure is covered with a first interlayer dielectric film 21 of $SiO_2$. The contact through holes CONT1 are formed in the interlayer dielectric film 21. The power source wiring VDD, the ground wiring VSS and the in-cell wirings 22 are formed on the interlayer dielectric film 21 and connected via the though holes CONT1. Each of the wirings VDD, VSS, and 22 is a three-layered metal film of Mo/Al/Mo.

The entire structure is covered with a second interlayer dielectric film 23 of $SiO_2$. The contact through holes CONT2 are formed in the interlayer dielectric film 23. The wirings 24 between the standard cells are an Al layer formed on the interlayer dielectric film 23, and the in-cell wirings 22 are connected via the contact through holes CONT2 to the wirings 24.

The entire structure is then covered with a protective dielectric film 25 of SiNx.

Here, the method for obtaining an array of crystal grains SX each of which has a nearly rectangular shape of about 4 by 4 μm in the semiconductor thin film 5 will be described in more detail.

When the transparent dielectric substrate 1 is a glass substrate having no high-temperature resistance as in the case where a monocrystalline silicon wafer is manufactured, it is most desirable to perform a laser annealing process for melting and recrystallizing an amorphous silicon by applies pulses of ultraviolet laser light, thereby obtaining the crystallized semiconductor thin film 5 in which the amorphous silicon is partially crystallized. At this time, in order to obtain crystal grains SX having the largest possible area, it is desirable to adopt a technique to make the laser beam intensity at the surface of the thin-film semiconductor substrate 1 have a spatial distribution using a phase shifter having a suitable pattern to thereby cause a lateral temperature gradient. Thereby, lateral crystal growth is induced, allowing an array of crystal grains each having a nearly rectangular shape of about 4 μm on a side to be obtained.

Next, a specific example of an annealing process using a phase shifter will be described with reference to FIG. 17.

Figure 17:
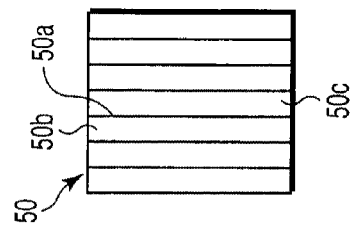
FIG. 17 is a diagram for explaining a phase shifter used in a laser-annealing process for forming the crystallized semiconductor thin film shown in FIG. 1.

The phase shifter 50 shown in FIG. 17 is formed of a transparent medium, such as quartz and has a pattern in which first and second strip portions (phase-setting portions) 50*b* and 50*c* of different thicknesses are arranged side by side. Incident laser light beams are diffracted and interfere with each other at the step boundaries (phase-shifting lines) 50*a* between the portions 50*b* and 50*c*. Thus, the phase shifter 50 imparts a periodical spatial distribution to the intensity of incident laser light beams. The laser light beam of phase π comes out from the first strip portion 50*b*, and the laser light beam of phase 0 comes out from the second strip portion 50*b*. Thus, the phase of the laser light beam from the first strip portion 50*b* is reversed to that of the laser light beam from the second strip portion 50*c* (a phase difference of 180° is obtained). Each of the strip portions 50*b* and 50*c* has a width of 10 μm. As an example, the phase shifter 50 is formed using a rectangular quartz substrate whose refractive index is 1.5 to obtain the above-mentioned phase difference with respect to laser light having a wavelength of 248 nm. In this case, the quartz substrate is etched for the strip portion 50*b*, thereby forming the strip portion 50*b* thinner than the strip portion 50*c*. The depth of etching is determined to 248 nm corresponding to phase π. In addition, the quartz substrate is not etched for the strip portion 50*c*.

Figure 18:
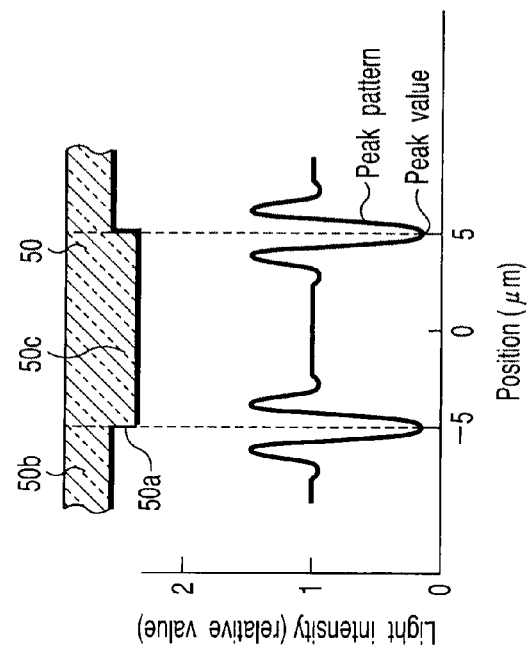
FIG. 18 shows the distribution of intensity of laser light applied to a semiconductor thin film via the phase shifter shown in FIG. 17.

In the phase shifter 50 thus fabricated, the laser light beam passed through the second strip portion 50*c* is delayed by 180° C. relative to the laser light beam passed through the first strip portion 50*b* smaller in thickness than the second ones. As the result, interference and diffraction occur between the laser light beam passed through the first strip portion 50*b* and the laser light beam passed through the second strip portion 50*c*, yielding such a laser light intensity distribution as shown in FIG. 18. Since the laser light beams from adjacent strip portions are reversed in phase, the intensity of the laser light at a position corresponding to the phase-shifting line between the adjacent strip portions becomes minimum, say, 0. Part in which the light intensity is minimum or the nearby part thereof forms nucleus that grow into crystal grains in crystallization of a semiconductor. Although, in the above example of the phase shifter 50, the phase-shifting lines extend in a form of parallel straight lines as shown in FIG. 17, this is not restrictive.

For example, it is also possible to array the phase-setting portions of phase 0 and of phase π in a checkered pattern, thereby causing the phase-shifting lines to cross at right angles. In this case, a grid-like pattern of light intensity 0 is obtained along the phase-shifting lines. For this reason, the crystalline nuclei are produced in arbitrary positions on the lines, leading to a difficult problem of control of the position and shape of crystal grains. For this reason, to control the production of crystalline nuclei, it is desirable that a point of intensity 0 is provided. For this reason, the amount of phase shift is set to less than 180° on the phase-shifting lines crossing at right angles. Thereby, the intensity is reduced but does not completely become 0 in positions corresponding to the phase shifting lines. At the same time, the intensity in positions corresponding to intersections can be made 0 by making the sum of complex transmittances around the intersection 0.

This will be described with reference to FIGS. 19 and 20. A mask 50 has a set of square patterns each comprised of four square portions 50*e*, 50*f*, 50*g* and 50*h* which are arranged side by side and are different in thickness as shown in FIG. 19. The square patterns are arranged side by side as shown in FIG. 20. The first square portion 50*e* is the thinnest and has its phase set to 0. The fourth square portion 50*h* is the thickest and has its phase different from the first square portion 50*e* by 3π/2. The second and third portions 50*f* and 50*g* have thicknesses between those of the square portions 50*e* and 50*h*, and have their phases different from the first square portion 50*e* by π/2 and π, respectively.

In such a mask, the location at which the first to fourth square portions adjoin, i.e., the center of the square pattern, forms a point of intensity 0. Therefore, the nuclei of a crystal grain grows from this point, allowing easy control of the position and shape of the crystal grain. A technique using such a phase shifter is described in the International Application No. PCT/JP03/03366, filed Mar. 19, 2003, by the same assignee as this application on the basis of the Japanese Patent Application No. 2002-120312.

FIG. 21 schematically shows the structure of an active-matrix liquid crystal display device into which thin-film transistor circuits designed through the design process shown in FIG. 5 are incorporated. This liquid crystal display device is equipped with an active matrix circuit AMX having liquid crystal pixels PX arrayed in a matrix form, a drive control circuit CNT, and a thin-film semiconductor substrate 1 that supports the active matrix circuit AMX and the drive control circuit CNT.

On the thin-film semiconductor substrate 1, the TFT active matrix circuit AMX has scanning lines 61 and video signal lines 62 which are arranged to intersect at right angles, and switching elements W each of which is formed of a thin-film transistor and is connected to the liquid crystal pixel PX placed in a respective one of the rectangular pixel areas defined by the lines 61 and 62. The drive control circuit CNT is composed of a scanning circuit 63, a signal supply circuit 64, a DC-DC converter 65, and a controller 66. These are integrated on the thin-film semiconductor substrate 1 using thin-film transistor circuits each comprised of a crystallized semiconductor thin film two-dimensionally partitioned into crystal-grain-defining areas each of which accommodates a crystal grain larger than a predetermined size, thin-film transistors each of which has a channel region placed at a position fixed in a corresponding one of the crystal-grain-defining areas, and wirings which interconnect the thin-film transistors. The controller 66 receives video data DATA and control signals from outside and performs required digital data processing to apply a scanning signal and a video signal to the scanning circuit 63 and the signal supply circuit 64. The DC-DC converter 65 converts a supply voltage DC from outside into voltages necessary for the scanning circuit 63 and the signal supply circuit 64. The scanning circuit 63 and the signal supply circuit 64 drive the liquid crystal pixels PX through the switching elements W.

The controller 66 depends to a large degree on customer specifications of the external interface and internal drive system, and is demanded to have an operation speed exceeding a specific speed. It is therefore desirable that the thin-film transistor circuit designed by the computer shown in FIG. 4 be mainly applied to the controller 66. By adopting the aforementioned design process using standard cells, the productivity is improved markedly in comparison with the conventional method in which all the thin-film transistor circuits are custom designed. Furthermore, by using standard cells in the crystallization array-pattern which reflect the specificity of crystal planar patterns as in the invention, substantially the same performance as when a monocrystalline semiconductor wafer is used can be obtained, allowing a higher-function and performance display device to be implemented. Moreover, the aforementioned thin-film transistor circuit design method exhibits a greater advantage in products in which not only the controller 66 but also more complicated digital logic circuits are integrated on a thin-film semiconductor substrate.

Figure 22:
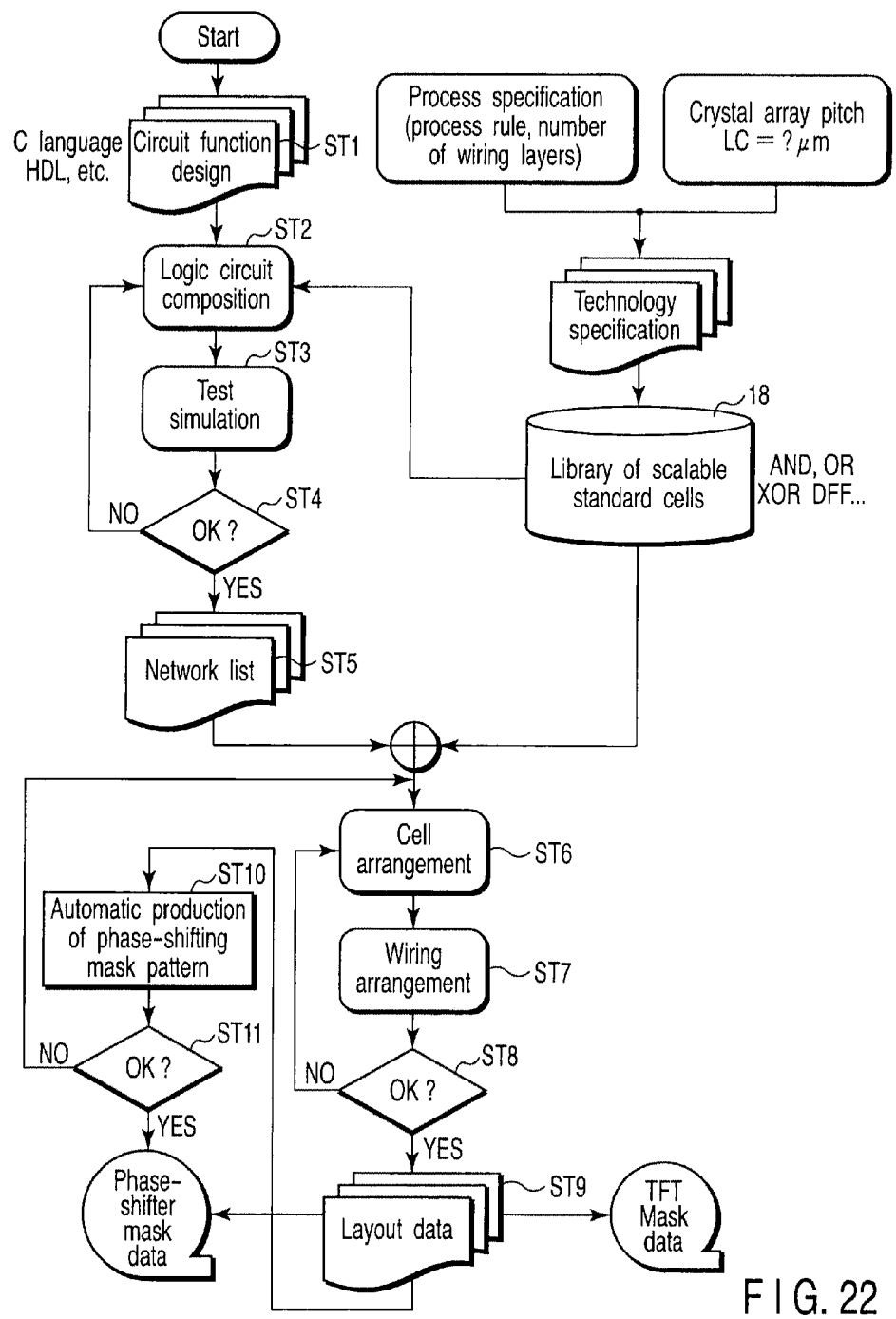
FIG. 22 is a flowchart illustrating the flow of a modification of the design process shown in FIG. 5.

The thin-film transistor circuit design process shown in FIG. 5 may be modified as shown in FIG. 22, for example. In this modification, a phase-shifting mask pattern is automatically produced using the layout data of the thin-film transistor circuit.

Steps ST1 to ST9 of this modification is identical to those of the design process shown in FIG. 5. That is, the function of a thin-film transistor circuit to be implemented is described in step ST1 in the hardware description language HDL or the C language higher in the level of abstract than HDL. Logic circuit composition is performed in step ST2 on the basis of the contents of the description. At this time, a reference is made to the aforementioned standard cell library. The function of the thin-film transistor circuit are verified in step ST3 by performing a test simulation. If the results of simulation are satisfactory, the results of the logic circuit composition is acknowledged in step ST4 and then a network list is created in step ST5. Subsequently, the cell arrangement of logic gate circuits is determined based on the network list and the cell library information in step ST6, and wirings between cells are then determined in step ST7. The arrangement of cells is verified again in step ST8. If desired specifications are satisfied, the thin-film transistor circuit is acknowledged. In step S9, the layout data of the thin-film transistor circuit obtained virtually in the above manner is stored into the hard disk drive 18. Further, the layout data is converted into photomask data for the thin-film transistor circuit and output to an external TFT mask data storage and phase-shifter mask data storage.

Thereafter, automatic production of a phase-shifting mask pattern is carried out in step ST10. The phase-shifting mask pattern is determined according to the crystallization array-pattern to define the crystal-grain-defining areas which are adapted to the device pattern of the thin-film transistors and realized on a semiconductor thin film by means of a laser-based crystallization method. When the phase-shifting mask pattern is obtained virtually in step ST10 and acknowledged in step ST11, the phase-shifting mask pattern is converted into photomask data for the phase shifter and output to the external phase-shifter mask data storage.

In addition, the above-mentioned phase-shifting mask pattern may include a portion for crystallizing a part of the semiconductor thin film as an alignment mark of a specified shape that is used to align the photomask for the thin-film transistor circuit with the semiconductor thin film after crystallization.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer program product for designing a thin-film transistor circuit using a crystallized semiconductor thin film, which contains crystal grains regularly grown in a lateral direction by crystallization and larger than a predetermined transistor channel size, the product comprising:
   a computer-readable storage device comprising:
   an instruction for causing at least one processor to define a crystallization array-pattern representing the arrangement of crystal-grain-defining areas which are arrayed for two-dimensional partitioning of the crystallized semiconductor thin film and each of which accommodates one of the crystal grains;
   an instruction for causing at least one processor to create, on the basis of the crystallization array-pattern, a device pattern of thin-film transistors each of which has a channel region placed at a position fixed in a corresponding one of the crystal-grain-defining areas and a wiring pattern of wirings which interconnect the thin-film transistors; and
   an instruction for causing at least one processor to determine a phase-shifting mask pattern according to the crystallization array-pattern to define the crystal-grain-defining areas.

2. The computer program product according to claim 1, wherein the phase-shifting mask pattern includes a portion for crystallizing a part of the semiconductor thin film as an alignment mark of a specified shape.

3. A computer-readable storage device, which stores a design program for a thin-film transistor circuit using a crystallized semiconductor thin film, which contains crystal grains regularly grown in a lateral direction by crystallization and larger than a predetermined transistor channel size, the device comprising executable instructions that, when executed by one or more processors, cause one or more processors to:
   define a crystallization array-pattern representing the arrangement of crystal-grain-defining areas which are arrayed for two-dimensional partitioning of the crystallized semiconductor thin film and each of which accommodates a crystal grain larger than a predetermined size;
   on the basis of the crystallization array-pattern, create a device pattern of thin-film transistors, each of which has a channel region placed at a position fixed in a corresponding one of the crystal-grain-defining areas and a wiring pattern of wirings which interconnect the thin-film transistors; and
   determine a phase-shifting mask pattern according to the crystallization array-pattern to define the crystal-grain-defining areas.

4. The device program according to claim 3, wherein the phase-shifting mask pattern includes a portion for crystallizing a part of the semiconductor thin film as an alignment mark of a specified shape.

* * * * *